United States Patent [19]

Chaw

[11] Patent Number: 5,672,990

[45] Date of Patent: Sep. 30, 1997

[54] EDGE-TRIGGER PULSE GENERATOR

[75] Inventor: Shyh-Liang Chaw, Tainan Hsien, Taiwan

[73] Assignee: United Microelectronics Corporation, Taipei, Taiwan

[21] Appl. No.: 592,542

[22] Filed: Jan. 26, 1996

[51] Int. Cl.[6] .................................................. H03K 5/13
[52] U.S. Cl. ........................ 327/176; 327/172; 327/173; 327/174; 327/294; 327/299
[58] Field of Search .................................. 327/172–174, 327/176, 261, 263, 269–271, 276, 277, 293, 294, 298, 299

[56] References Cited

U.S. PATENT DOCUMENTS

| 5,309,034 | 5/1994 | Ishibashi | 327/172 |
| 5,396,110 | 3/1995 | Houston | 327/172 |

FOREIGN PATENT DOCUMENTS

| 4-331506 | 11/1992 | Japan | 327/172 |
| 6-188698 | 7/1994 | Japan | 327/263 |

*Primary Examiner*—Timothy P. Callahan
*Assistant Examiner*—T. T. Lam
*Attorney, Agent, or Firm*—Cushman Darby & Cushman IP Group of Pillsbury Madison & Sutro, LLP

[57] ABSTRACT

An edge-trigger pulse generator that is suitable for use in a signal generator is disclosed, including positive and negative logic embodiments. The positive logic embodiment includes: a first time-delay circuit for delaying and inverting an input pulse; a second time-delay circuit for broadening the width of the input pulse; a NAND gate for receiving outputs of the first time-delay circuit and the second time-delay circuit, and performing a NAND logical operation for the outputs; and an inverter for receiving and inverting output of the NAND gate, so that the width of an pulse output from the edge-trigger pulse generator can be determined merely by the edge-trigger pulse generator while the width of the input pulse is not wider than a predetermined width. The negative logic embodiment replaces the NAND gate with NOR gate and has a second time-delay circuit that is different from the second time-delay circuit of the first embodiment. Both of the embodiments can output a pulse having a width that is wider than a predetermined pulse width to prevent malfunction of a system utilizing the edge-trigger pulse generator as a signal generator.

8 Claims, 5 Drawing Sheets

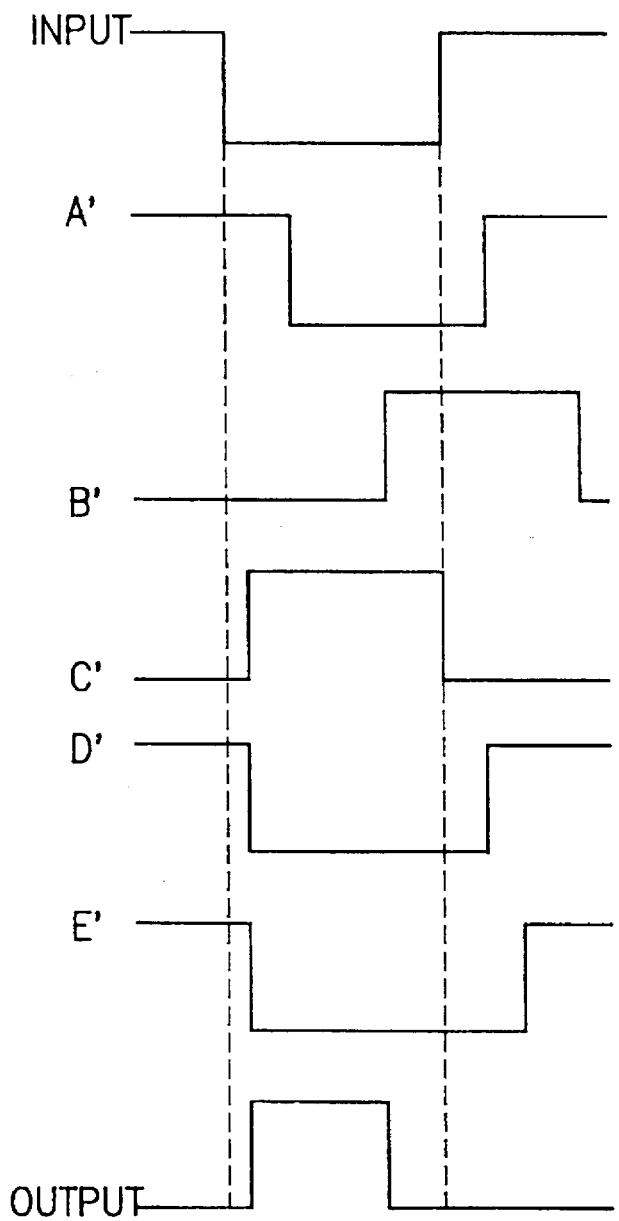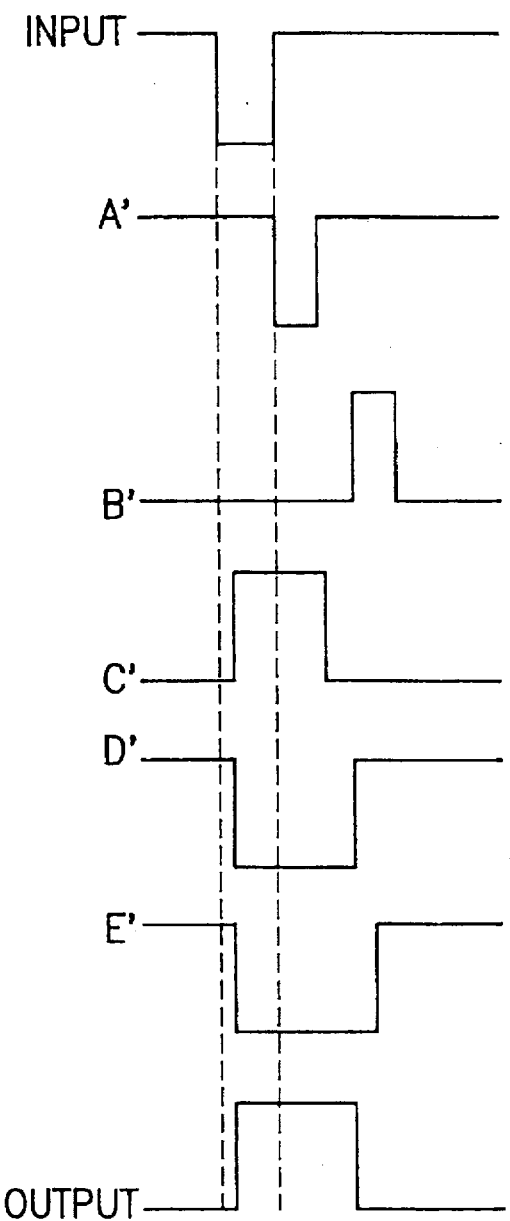
FIG. 8aFIG. 8b

EDGE-TRIGGER PULSE GENERATOR

BACKGROUND OF THE INVENTION

1. Field of the Invention

The present invention relates to a waveform generator, and more particularly to an edge-trigger pulse generator.

2. Description of Prior Art

Normally, an edge-trigger pulse generator includes a time-delay circuit, an inverter and a NAND gate or NOR gate. FIG. 1 (Prior Art) is a schematic diagram of a positive-logic edge-trigger pulse generator which includes a time-delay circuit 10, a NAND gate 12 and an inverter 14. A positive-logic edge-trigger pulse generator has the following operational features:

- the output should be and remain "low" and be stable while the input is stable;
- the output should be and remain "low" when the input changes from "high" to "low"; and
- the output should change from "low" to "high" when the input changes from "low" to "high", and the output should return to "low" after a predetermined time delay (time-delay circuit 10).

FIG. 2a (Prior Art) is a timing diagram showing input and output waveforms of a conventional edge-trigger pulse generator. The width of an output pulse generated by a conventional edge-trigger pulse generator substantially depends on amount of delay caused by time-delay circuit 10 and the the width of the input pulse. As long as the input pulse is wide enough, a proper output will be obtained.

FIG. 2b (Prior Art) is a timing diagram of input and output pulses of the conventional edge-trigger pulse generator. However, in this case, the width of an output pulse is very small. A small pulse maybe easily filtered out by RC effect of transmission line, before the pulse is transmitted to the next circuit stage. A malfunction can occur if the input pulse is not wide enough.

FIG. 3 (Prior Art) is a schematic diagram of a conventional negative logic edge-trigger pulse generator which includes a time-delay circuit 10 and a NOR gate 16.

A negative-logic edge-trigger pulse generator should have the following operational features:

- the output should remain "low" and be stable while the input is stable;
- the output should remain "low" when the input changes from "low" to "high"; and
- the output should change from "low" to "high" when the input changes from "high" to "low", and the output should return to "low" after a predetermined time delay (time-delay circuit 10).

FIG. 4a (Prior Art) is a timing diagram showing input and output waveforms of the conventional negative logic edge-trigger pulse generator. As long as the input pulse is wide enough, a proper output will be obtained.

FIG. 4b (Prior Art) is a timing diagram of input and output pulses of the conventional negative logic edge-trigger pulse generator. However, in this case, the width of an output pulse is very small. A small pulse maybe easily filtered out by RC effect of transmission line, before the pulse is transmitted to the next circuit stage. A malfunction can occur if the input pulse is not wide enough.

SUMMARY OF THE INVENTION

Accordingly, to overcome the problems that occur when using a conventional edge-trigger pulse generators, the primary object of the present invention is to provide an edge-trigger pulse generator that outputs a pulse having a predetermined minimum pulse width. This prevents problems from occurring in systems that utilize the edge-trigger pulse generator as a system signal generator.

A positive logic embodiment of the edge-trigger pulse generator includes a first time-delay circuit for delaying and inverting an input pulse. A second time-delay circuit broadens the width of the input pulse. A NAND gate has a first input for receiving an output from the first time-delay circuit and a second input for receiving an output from the second time-delay circuit and provides a logical NAND output. An inverter inverts the output of the NAND gate, so that the width of a pulse output from the edge-trigger pulse generator can be determined merely by the edge-trigger pulse generator while the width of the input pulse is not wider than a predetermined width.

A negative logic embodiment includes a first time-delay circuit for delaying and inverting an input pulse. A second time-delay circuit broadens the width of the input pulse. A NOR gate has a first input for receiving an output from the first time-delay circuit and a second input for receiving an output from the second time-delay circuit and providing a logical NOR output. An inverter inverts the output of the NOR gate so that the width of an pulse output from the edge-trigger pulse generator can be determined merely by the edge-trigger pulse generator while the width of the input pulse is not wider than a predetermined width.

BRIEF DESCRIPTION OF THE DRAWINGS

The following detailed description, given by way of example and not intended to limit the invention solely to the embodiments described herein, will best be understood in conjunction with the accompanying drawings in which:

FIGS. 8a and 8b show the timing relationship between an input pulse and an output pulse of the edge-trigger pulse generator as shown in FIG. 7.

In the figures, identical reference numbers represent the like or corresponding elements.

DETAILED DESCRIPTION OF THE PREFERRED EMBODIMENTS

Figure 1:
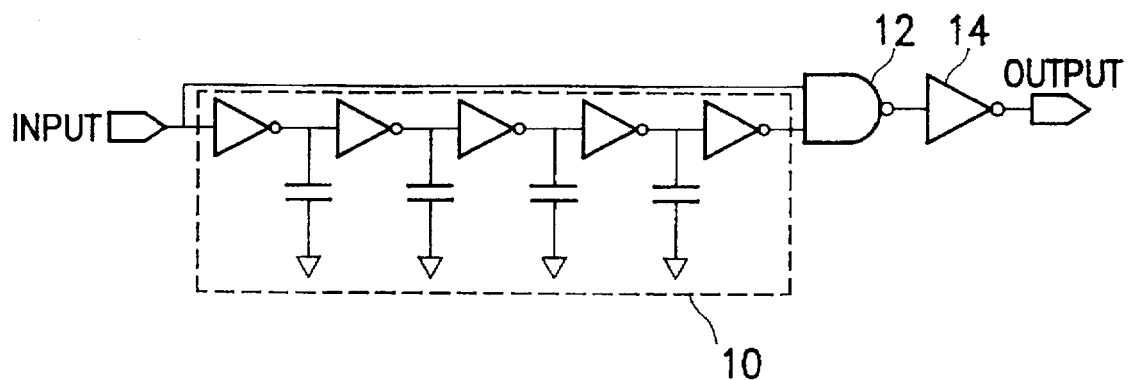
FIG. 1 (Prior Art) is a circuit diagram of a known positive-logic edge-trigger pulse generator.
Figure 2A:
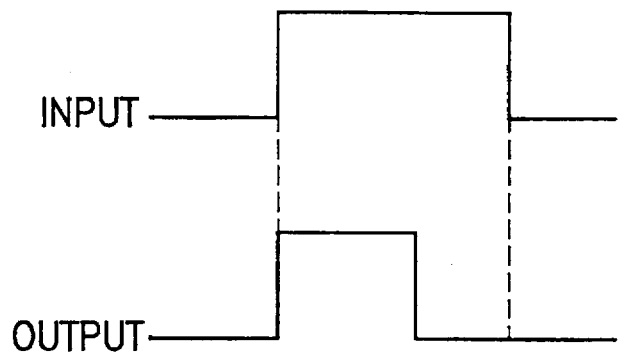
FIG. 2a (Prior Art) and 2b (Prior Art) show the timing relationship between an input pulse and an output pulse of the edge-trigger pulse generator shown in FIG. 1.
Figure 2B:
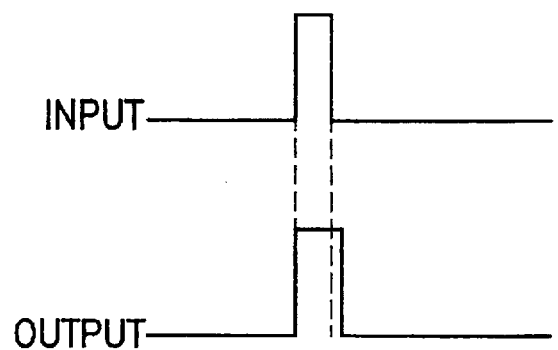
Figure 3:
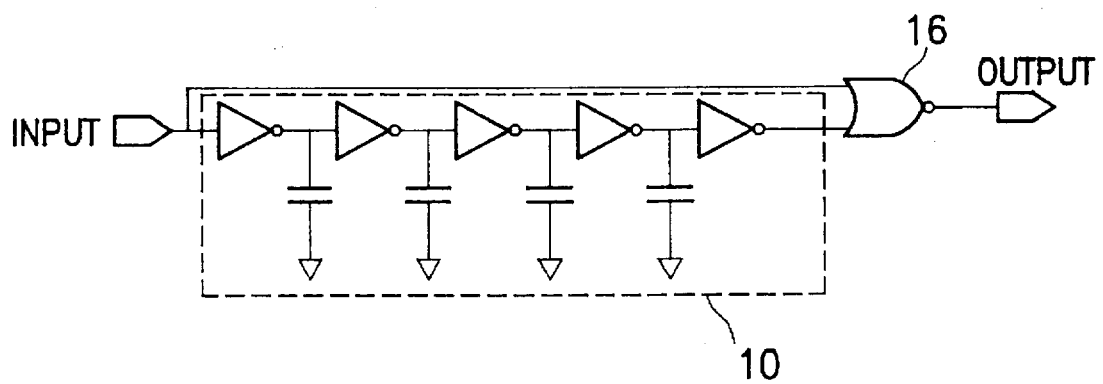
FIG. 3 (Prior Art) is a circuit diagram of a known negative-logic edge-trigger pulse generator.
Figure 4A:
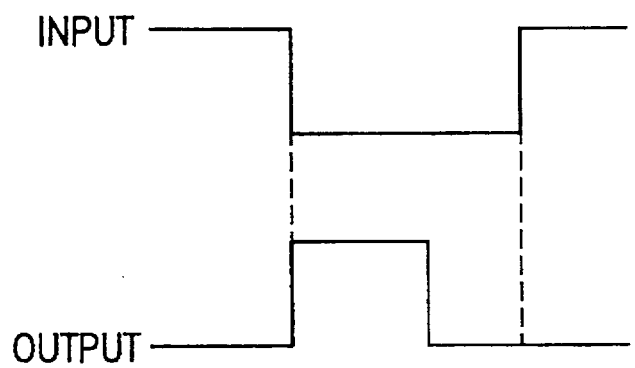
FIGS. 4a (Prior Art) and 4b (Prior Art) show the timing relationship between an input pulse and an output pulse of the edge-trigger pulse generator shown in FIG. 3.
Figure 4B:
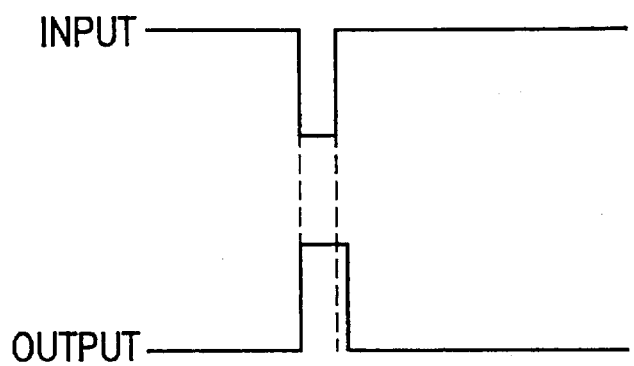
Figure 5:
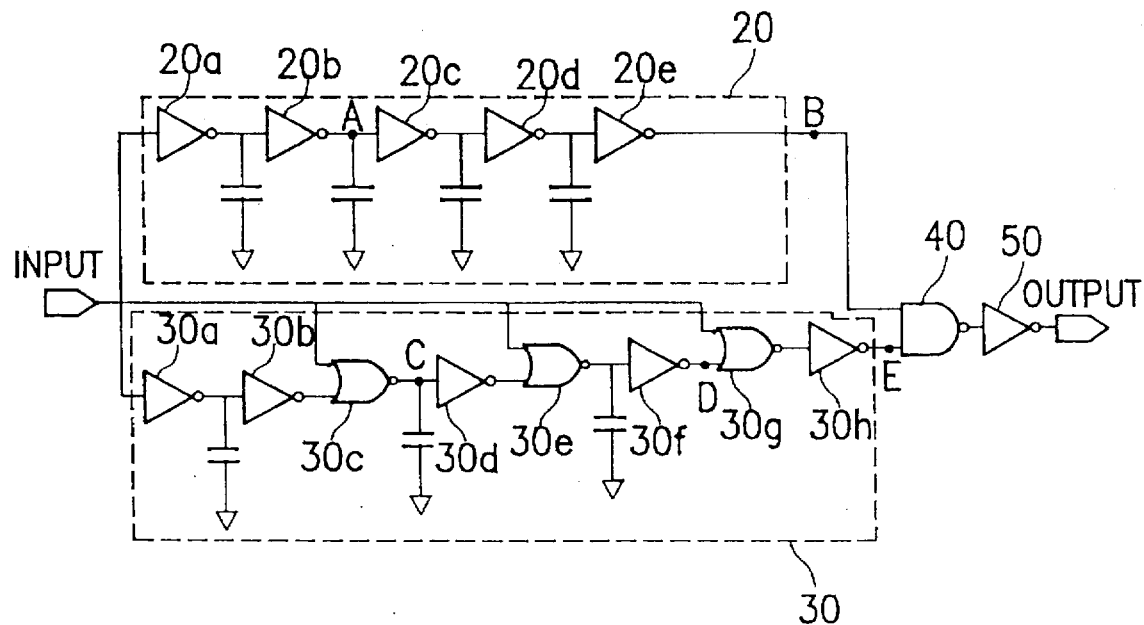
FIG. 5 is a circuit, diagram of a positive-logic edge-trigger pulse generator according to the present invention.

FIG. 5 is a circuit diagram of a positive-logic edge-trigger pulse generator according to the present invention. The pulse generator includes a first time-delay circuit 20, a second time-delay circuit 30, a NAND gate 40 and an inverter 50. The first time-delay circuit 20 includes a plurality of inverters 20a to 20e and a plurality of capacitors, as shown in the drawing, each coupling a respective inverter output to ground. The second time-delay circuit 30 includes a plurality of inverters 30a, 30b, 30d, 30f and 30h, a plurality of NOR gates 30c, 30e and 30g, and a plurality of capacitors, as shown in the drawing.

Figure 6A:
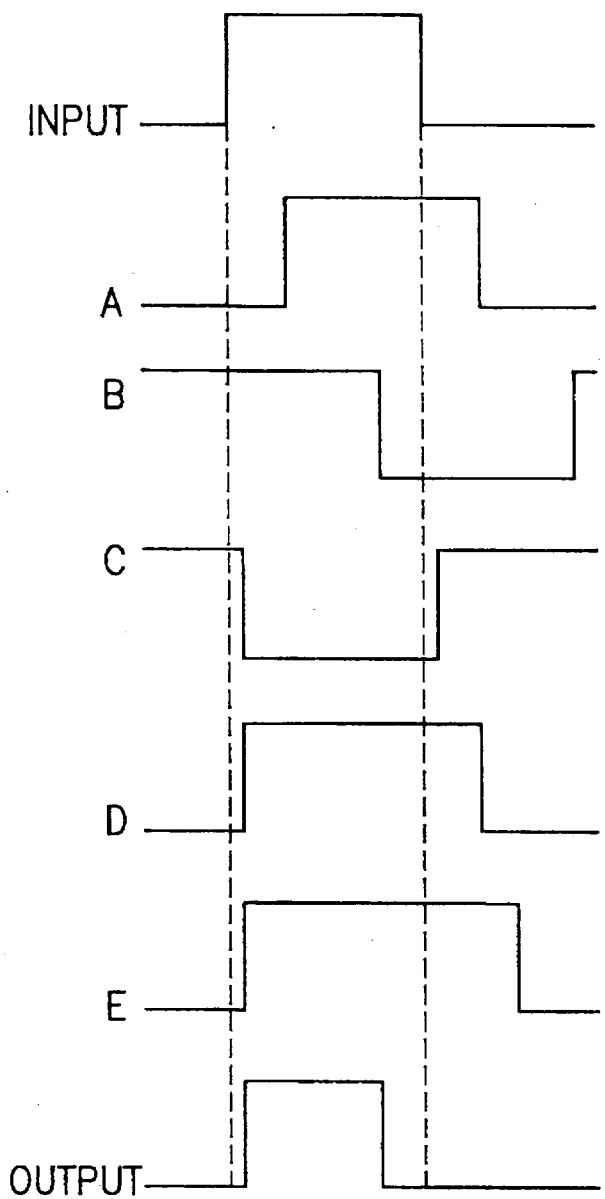
FIGS. 6a 6b timing relationship between an input pulse and an output pulse of the edge-trigger pulse generator as shown in FIG. 5.
Figure 6B:
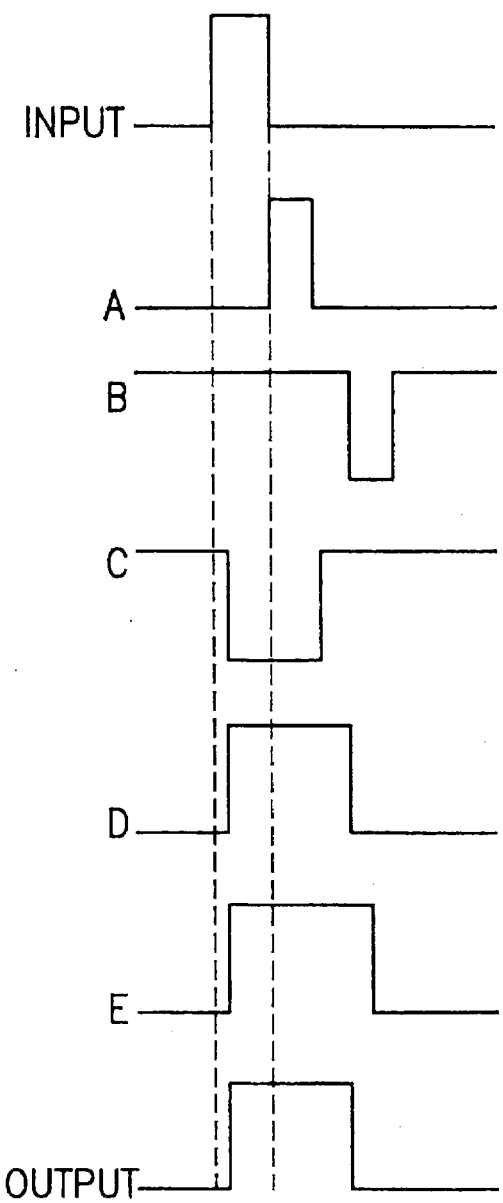

FIGS. 6a and 6b illustrate the relationship between an input pulse and an output pulse in the edge-trigger pulse generator as shown in FIG. 5. Five points A, B, C, D and E labeled on FIG. 5 are selected to look at the operation of the circuit. The waveforms at the input and output of the FIG. 5 circuit, along with the waveforms at points A, B, C, D, and E are shown in FIGS. 6a and 6b.

In FIG. 6a, an input pulse is shown on the top line of the figure. This input pulse represents a "wide" input pulse. Conversely, the input pulse shown in the top line of FIG. 6b represents a "narrow" input pulse. In the case of a "wide" input pulse, as shown in FIG. 6a, at point A in the first time-delay circuit 20, the waveform is delayed for a period of time but is unchanged in shape after the input pulse is transmitted through inverters 20a and 20b. At point B in the first time-delay circuit 20, the pulse has passed through three more inverters 20c, 20d and 20e. Therefore, the waveform is delayed and inverted with respect to the input waveform. At point C in the second time-delay circuit 30, the waveform is broadened and inverted with respect to the input waveform after passing through inverters 30a and 30b and a NOR gate 30c. At point D in the second time-delay circuit 30, after passing through inverters 30d and 30f and a NOR gate 30e, the waveform is inverted again and broadened. At point E, after passing through a NOR gate 30g and an inverter 30h, the pulse width is broadened but not inverted. The output pulse is obtained by using the waveforms at B and E as inputs to NAND gate 40. The output of NAND gate 40 is inverted by an inverter 50. Comparing with the prior-art edge-trigger pulse generator, it can be inferred that the edge-trigger pulse generator of the present invention provides the same type of output as that of the prior-art, but is capable of operating on a wider input pulse.

As stated above, FIG. 6b illustrates the situation when the input pulse is "narrow". At point A in the first time-delay circuit 20, the waveform is delayed for a period of time but is unchanged in shape after the input pulse is transmitted through inverters 20a and 20b. At point B in the first time-delay circuit 20, the pulse has passed through three more inverters 20c, 20d and 20e. Therefore, the waveform is delayed and inverted with respect to the input pulse. At point C in the second time-delay circuit 30, the waveform is broadened and inverted with respect to the input pulse after passing through inverters 30a and 30b and NOR gate 30c. At point D in the second time-delay circuit 30, after passing through inverters 30d and 30f and a NOR gate 30e, the waveform is inverted and broadened. At point E, passing through a NOR gate 30g and an inverter 30h, the width of the pulse is broadened but not inverted. Finally, the output pulse is obtained by utilizing the pulses at points B and E as inputs to NAND gate 40. The output of NAND gate 40 is inverted by inverter 50. Comparing with the prior-art edge-trigger pulse generator, it can be found that the width of the output pulse is primarily controlled by the output of the second time-delay circuit 30. Because the pulse width of a pulse inputted in the second time-delay circuit 30 is broadened while passing through the circuit, the output pulse of the edge-trigger pulse generator may remain at a predetermined width even if the width of an input pulse is narrow. The output pulse will not be filtered out during transmitting from one stage of circuit to its next stage in a system. Therefore, the edge-trigger pulse generator of the present invention can prevent the resulting malfunctioning of the system that may often occur in a system adopting the prior-art pulse generator.

Figure 7:
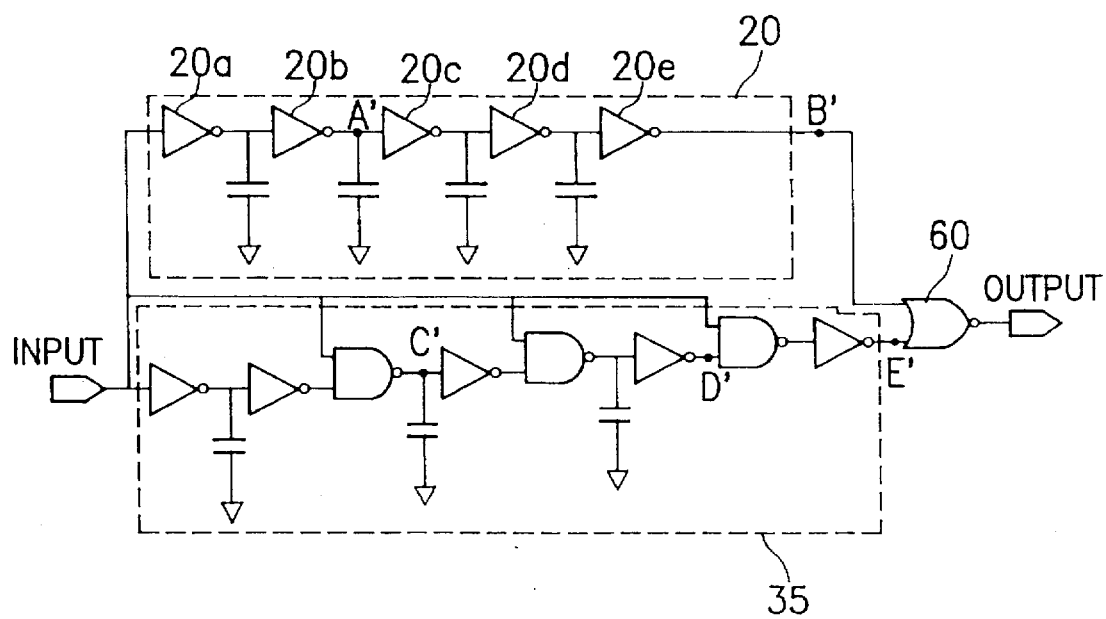
FIG. 7 is a circuit diagram of a negative-logic edge-trigger pulse generator according to the present invention.

The principles of the present invention can also be applied to a negative-logic edge-trigger pulse generator as shown in FIG. 7. The negative-logic edge-trigger includes a first time-delay circuit 20, a third time-delay circuit 35 and a NOR gate 60. The first time-delay circuit 20 is the same as in the FIG. 5 embodiment. However, the third time-delay circuit 35 of FIG. 7 is different from the second time delay circuit 30 of the FIG. 5 embodiment. The third time-delay circuit 35 includes a plurality of inverters, a plurality of capacitors and a plurality of NAND gates.

FIGS. 8a and 8b correspond to FIG. 7 in the same manner that FIGS. 6a and 6b correspond to FIG. 5. The circuit nodes A', B', C', D' and E', along with the input and output, shown in FIG. 7 are selected to illustrate the operation of the embodiment. The actual waveforms are shown in FIGS. 8a and 8b.

In the FIG. 7 embodiment, the output pulse becomes "high" when the input pulse goes "low". The operation of the FIG. 7 embodiment is analogous to the operation of the FIG. 5 embodiment. Therefore, a detailed description is not provided here. It should be understood from FIGS. 8a and 8b that this embodiment has the same effect as the first embodiment. That is, the edge-trigger pulse generator of the present invention can prevent the resulting malfunctioning of the system that may often occur in a system adopting the prior-art pulse generator.

In both embodiments, the width of an output pulse can be adjusted by changing the number of inverters and logical gates in the time-delay circuits.

What is claimed is:

1. An edge-trigger pulse generator comprising:

a first time-delay circuit for delaying and inverting an input pulse;

a second time-delay circuit for broadening the width of the input pulse;

a NAND gate having a first input for receiving an output pulse from the first time-delay circuit and a second input for receiving an output pulse from the second time-delay circuit and providing a logical NAND output; and an inverter for receiving and inverting the output of the NAND gate, so that the width of an pulse output from the edge-trigger pulse generator can be determined merely by the edge-trigger pulse generator while the width of the input pulse is not wider than a predetermined width.

2. An edge-trigger pulse generator as claimed in claim 1 wherein the first time-delay circuit includes an odd number of inverters, and a plurality of capacitors, each capacitor connecting a point between two neighboring inverters to ground.

3. An edge-trigger pulse generator as claimed in claim 1 wherein the second time-delay circuit includes a plurality of inverters, at least one NOR gate and at least one capacitor.

4. An edge-trigger pulse generator as claimed in claim 3 wherein the second time-delay circuit includes a first inverter, a second inverter and at least one set of an inverter and NOR gate serially connected to the first inverter and the second inverter, each set of said inverter and NOR gate having a point between the inverter and the NOR gate connecting a capacitor to ground, one input terminal of each NOR gate connecting to said input pulse.

5. An edge-trigger pulse generator comprising:
- a first time-delay circuit for delaying and inverting an input pulse;
- a second time-delay circuit for broadening the width of the input pulse; and
- a NOR gate having a first input for-receiving an output pulse from the first time-delay circuit and a second input for receiving an output pulse from the second time-delay circuit and providing a logical NOR output serving as the output of the edge-trigger pulse generator.

6. An edge-trigger pulse generator as claimed in claim 5 wherein the first time-delay circuit includes an odd number of inverters, and a plurality of capacitors, each capacitor connecting a point between two neighboring inverters to ground.

7. An edge-trigger pulse generator as claimed in claim 5 wherein the second time-delay circuit includes a plurality of inverters, at least one NAND gate and at least one capacitor.

8. An edge-trigger pulse generator as claimed in claim 7 wherein the second time-delay circuit includes a first inverter, a second inverter and at least one set of an inverter and NAND gate serially connected to the first inverter and the second inverter, each set of inverter and NAND gate having a node between the inverter and the NAND gate connected to a capacitor having a grounded terminal.

* * * * *